United States Patent [19]
Clark, Jr. et al.

[11] Patent Number: 5,690,807
[45] Date of Patent: Nov. 25, 1997

[54] METHOD FOR PRODUCING SEMICONDUCTOR PARTICLES

[75] Inventors: Harry R. Clark, Jr., Townsend; Brian S. Ahern, Boxboro, both of Mass.

[73] Assignee: Massachusetts Institute of Technology, Cambridge, Mass.

[21] Appl. No.: 510,802

[22] Filed: Aug. 3, 1995

[51] Int. Cl.$^6$ .................................................. C25F 3/12
[52] U.S. Cl. ........................ 205/655; 205/656; 205/674; 205/684
[58] Field of Search ............................... 205/656, 674, 205/684, 655

[56] References Cited

U.S. PATENT DOCUMENTS

| | | | |
|---|---|---|---|
| 2,871,174 | 1/1959 | Turner | 205/674 |
| 4,482,443 | 11/1984 | Bacon et al. | 205/684 X |
| 4,931,692 | 6/1990 | Takagi et al. | 313/503 |
| 4,995,954 | 2/1991 | Guilinger et al. | 205/674 X |
| 5,139,624 | 8/1992 | Searson et al. | 205/684 X |
| 5,156,885 | 10/1992 | Budd | 427/70 |
| 5,227,034 | 7/1993 | Stein et al. | 205/674 |
| 5,358,600 | 10/1994 | Canham et al. | 205/656 X |
| 5,434,878 | 7/1995 | Lawandy | 372/43 |
| 5,442,254 | 8/1995 | Jaskie | 313/485 |

FOREIGN PATENT DOCUMENTS 0622439  11/1994  European Pat. Off. ........ C09K 11/00

OTHER PUBLICATIONS

Reetz et al., "Size-Selective Synthesis of Nanostructured Transition Metal Clusters," *J. Am. Chem. Soc.*, vol. 116, No. 16, pp. 7401–7402, 1994 no month.

Furukawa et al., "Quantum size effects on the optical band gap of microcrystalline Si:H," *Phys. Rev. B*, vol. 38, No. 8, pp. 5726–5729, Sep. 15, 1988.

DiMaria et al., "Electroluminescence studies in silicon dioxide films containing tiny silicon islands," *J. Appl. Phys.*, vol. 56, No. 2, pp. 401–416, Jul. 15, 1984.

Juen et al., "Technology and photoluminescence of GaAs micro-and nanocrystallites," *Super-lattices and Microstructures*, vol. 11, No. 2, pp. 181–184, 1992 no month.

Chiu et al., "Gas Phase Synthesis and Processing of Silicon Nanocrystallites: Characterization by Photoluminescence Emission Spectroscopy," *Jnl. Elec. Mater.*, v. 23, N. 4, pp. 347–354, 1994 no month.

Littau et al., "A Luminescent Silicon Nanocrystal Colloid via a High-Temperature Aerosol Reaction," *J. Phys. Chem.*, vol. 97, No. 6, pp. 1224–1230, 1993 no month.

Fojtik et al., "Luminescent colloidal silicon particles," *Chemical Physics Letters*, vol. 221, pp. 363–367, Apr. 29, 1994.

Zhao et al., "Observation of Direct Transitions in Silicon Nanocrystallites," *Jpn. J. Appl. Phys.*, vol. 33, Part 2, No. 7A, pp. L899–L901, Jul. 1, 1994.

(List continued on next page.)

*Primary Examiner*—Donald R. Valentine
*Attorney, Agent, or Firm*—Theresa A. Lober

[57] ABSTRACT

The invention provides a method for producing semiconductor particles in which a semiconductor material of the type for which particles are desired is placed in an electrolytic solution of an anodic cell. The anodic cell is configured with a cathode also positioned in the electrolytic solution. The electrolytic solution of the anodic cell includes an etchant and a surfactant that is characterized by an attractive affinity for the semiconductor material. To produce semiconductor particles from the semiconductor material, an electrical potential is applied between the semiconductor material in the electrolytic solution and the cathode in the electrolytic solution to anodically etch the semiconductor material. During the etch process, particles of the semiconductor material form and are encapsulated by the surfactant. This method for producing semiconductor particles uses an uncomplicated apparatus and procedure that results in inexpensive and high-volume production of particles of a semiconductor material.

23 Claims, 1 Drawing Sheet

OTHER PUBLICATIONS

Ghandhi, *VLSI Fabrication Principles*, John Wiley & Sons, New York, no month 1983.

Wolf et al., *Silicon Processing for the VLSI Era*, vol. 1, Lattice Press, Sunset Beach, CA, no month 1986.

Greef et al., *Instrumental Methods in Electrochemistry*, John Wiley & Sons, New York, no month 1990.

Lehmann, "The Physics Macropore Formation in Low Doped n–Type Silicon," *J. Electrochem. Soc.*, vol. 140, No. 10, pp. 2836–2843, Oct., 1993.

Koch, "The synthesis and structure of nanocrystalline materials produced by mechanical attrition: a review," *Nanostructured Materials*, vol. 2, pp. 109–129, 1993.

Schoenfeld et al., "Formation of nanocrystallites in amorphous silicon thin films," *Jnl. of Crystal Growth*, vol. 142, pp. 268–270, no month 1994.

Bhargava et al., "Doped nanocrystals of semiconductors–a new class of luminescent materials," *Journal of Luminescence*, vol. 60&61, pp. 275–280, no month 1994.

Reed, "Quantum Dots," *Scientific American*, pp. 118–123, Jan. 1993.

Arakawa et al. "Fabrication and optical properties of GaAs quantum wires and dots by MOCVD selective growth," *Semicond. Sci. Technol.*, vol. 8, pp. 1082–1088, no month 1993.

Chen et al., "Novel fabrication method for nanometer–scale silicon dots and wires," *Appl. Phys. Letters*, vol. 62, No. 16, pp. 1949–1951, Apr. 19, 1993.

Tamir et al., "Laser induced deposition on nanocrystalline Si with preferred crystallographic orientation," *Applied Surface Science*, vol. 86, pp. 514–520, no month 1995.

METHOD FOR PRODUCING SEMICONDUCTOR PARTICLES

GOVERNMENT RIGHTS IN THE INVENTION

This invention was made with U.S. Government support under contract No. F19628-95-C-0002, awarded by the Air Force. The U.S. Government has certain rights in this invention.

FIELD OF THE INVENTION

This invention relates to techniques for producing nanometrically-sized materials, and more particularly relates to techniques for producing nanometric crystalline semiconducting material particles.

BACKGROUND OF THE INVENTION

Semiconductor particles, and particularly semiconductor particles having a size in the nanometer regime, i.e., in the range of 1–1000 nanometers, are rapidly gaining interest for their quantum confinement effects, and notably for their luminescence properties. Nanometric particles of the semiconductor silicon are of particular interest for their capability to luminescence in the wavelength regime of visible light. Such silicon luminescence has been reported by, among others, DiMaria et al., in "Electroluminescence Studies in Silicon Dioxide Films Containing Tiny Silicon Islands," *J. Appl. Phys.*, Vol. 56, No. 2, pp. 401–416, July 1984, and has been investigated for luminescence properties induced by both electrical and optical stimuli.

Following this interest in semiconductor particle properties, many techniques have been proposed for producing such nanometrically-sized particles. For example, wet grinding and micromilling of a bulk semiconductor sample has been suggested by, among others, Juen et al., in "Technology and Photoluminescence of GaAs Micro- and Nanocrystallites," *Superlatt. and Microstr.*, Vol. 11, No. 2, pp. 181–184, 1992. Here a block of semiconductor material is ground in water to produce semiconductor particulates. The minimum size of particulates produced by such a grinding technique or other mechanical attrition processes is fundamentally limited by energy considerations to a size much larger than nanometers, however, for typical semiconductor materials of interest. Indeed, the minimum particulate diameter, $d_m$, that can be produced by such a mechanical technique is given as:

$$d_m = \frac{32}{3} ER/Y^2, \quad (1)$$

where Y is the yield strength of the material being mechanically processed, E is the Young's modulus of the material being mechanically processed, and R is the fracture strength of the material being processed. For a given material, particle sizes less than the value of $d_m$ are plastically deformed, rather than cracked apart, by a mechanical attrition process like grinding. As a result, particles of typical semiconductor materials, such as silicon, can be mechanically ground to an average size that is no less than on the order of 1 μm; this size is larger than the nanometric semiconductor particle size now widely desired.

In another proposed process, as described, e.g., by Chiu et al., in "Gas Phase Synthesis and Processing of Silicon Nanocrystallites: Characterization by Photoluminescence Emission Spectroscopy," *Jnl. Elect. Mater.*, Vol. 23, No. 3, pp. 347–354, 1994, a polycrystalline rod of a semiconductor, e.g., silicon, is ablated by laser pulses in an inert atmosphere such as helium (He). In this process, a semiconductor plasma is produced by the laser pulses and is carried by the He into a vacuum system. The He experiences adiabatic cooling in the vacuum, which correspondingly cools the plasma such that it condenses to form semiconductor particles. Although this process is capable of producing particles having sizes in the range of 1–100 nanometers, the volume of particles produced for a given volume of carrier gas and for a reasonable ablation time is quite small. As a result, an extremely large volume of carrier gas and lengthy ablation process is required to produce a supply of nanoparticles adequate for most applications.

An alternative process, reported by, among others, Littau et al., in "A Luminescent Silicon Nanocrystal Colloid via a High-Temperature Aerosol Reaction," *J. Phys. Chem.* Vol. 97, No. 6, pp. 1224–1230, 1993, is based on high-temperature pyrolysis of dilute silane gas in helium to produce silicon nanoparticles. A somewhat similar process is proposed by Fojtik et at., in "Luminescent Colloidal Silicon Particles," *Chem. Phys. Lett.*, Vol. 221, pp. 363–367, 1994; here silane gas is combusted in a syringe to produce silicon nanoparticles. Takagi et al., in U.S. Pat. No. 4,931,692, propose decomposition of a microwave-induced plasma of silane gas and hydrogen gas to form silicon particles. All three of these high-temperature processes are inherently limited by the nature of the silane decomposition reaction to producing very low volumes of nanoparticles for a given volume of feed gas. Production of any appreciable volume of nanoparticle products by these processes therefore requires an impractical volume of feed gas and an impractical process time.

An alternative class of nanoparticle production techniques is characterized by processing of a deposited layer of material. For example, as described by Zhao et al., in "Observation of Direct Transitions in Silicon Nanocrystallites," *Jpn. J. Appl. Phys.*, Vol. 33, Part. 2, No. 7A, pp. L899–L901, 1994, a thin, electron-beam deposited layer of amorphous silicon can be annealed to crystallize nanometrically-sized crystals in the deposited layer. Like those processes discussed above, such a deposition technique is inherently limited to produce low volumes of nanocrystals; in this case, the electron-beam deposition process is the limiting process. Nanoparticle production in a deposited layer is further limited in that the produced nanoparticles are bound in the layer and thus are not accessible for processing of particles separated outside of the layer.

From this discussion alone it is seen that a wide range of processes have been suggested for production of semiconductor particles having a size of less than 1000 nanometers. Yet all of the suggested processes are inherently suboptimal due to one or more limitations inherent in the process mechanisms themselves. Many of the processes require impractical amounts of feed gases and impractical process times to produce any appreciable amount of product; others produce particles that can be collected only as a dense film and that can thus not be accessed individually; most of the processes produce a wide range of sizes and structures that must be intricately processed to separate out a volume of a desired particle size. Thus, efforts at producing nanometrically-sized semiconductor particles under practical process conditions have heretofore been unsuccessful.

SUMMARY OF THE INVENTION

The invention overcomes the limitations of conventional semiconductor nanoparticle production processes to provide a method for producing semiconductor particles by way of a relatively fast process that does not require large volumes of starting material for producing a reasonable volume of produced semiconductor nanoparticles.

Accordingly, in general, the invention provides a method for producing semiconductor particles in which a semiconductor material of the type for which particles are desired is placed in an electrolytic solution of an anodic cell. The anodic cell is configured with a cathode also positioned in the electrolytic solution. The electrolytic solution of the anodic cell includes an etchant and a surfactant that is characterized by an attractive affinity for the semiconductor material. To produce semiconductor particles from the semiconductor material, an electrical potential is applied between the semiconductor material in the electrolytic solution and the cathode in the electrolytic solution to anodically etch the semiconductor material. During the etching process, particles of the semiconductor material form and are encapsulated by the surfactant.

This method for producing semiconductor particles employs an uncomplicated apparatus and procedure that results in inexpensive and high-volume production of particles of a semiconductor material.

In preferred embodiments, the cathode of the anodic cell consists of a noble metal, preferably platinum. In other preferred embodiments, the etchant in the anodic cell electrolytic solution consists of hydrofluoric acid and may also include ammonium fluoride; preferably, the solution also includes a solvent, such as methanol. In other preferred embodiments, the surfactant in the electrolytic solution is a compound that is characterized as an alkanolamine, or in other embodiments, that is polyethyleneimine.

Preferably, the electrical potential applied between the semiconductor material and the cathode in the anodic cell electrolytic solution is set at a potential to bias the semiconductor material at a positive electrical voltage with respect to the cathode. In other preferred embodiments, the semiconductor material is illuminated while it is positioned in the anodic cell electrolytic solution.

In other embodiments, the semiconductor particles are separated out of the anodic cell electrolytic solution, preferably by filtering or by centrifuging the particles. In preferred embodiments, the separated semiconductor particles are annealed or etched.

In other preferred embodiments, the semiconductor material consists of a semiconductor wafer, preferably of silicon or silicon carbide. Preferably, at least a portion of the semiconductor particles formed by the process of the invention are of a size less than about 1000 nm, preferably less than about 100 nm, and most preferably less than about 10 nm.

Semiconductor particles produced by the etching process provided by the invention are particularly well-suited to a wide range of microelectronic applications, including quantum dot microelectronic devices, electroluminescent display devices, photoluminescent display devices, and the many other microelectronic applications for which nanometrically-sized semiconductor particles are used. Other features and advantages of the invention will be apparent from the description of a preferred embodiment, and from the claims.

DESCRIPTION OF A PREFERRED EMBODIMENT

Figure 1:
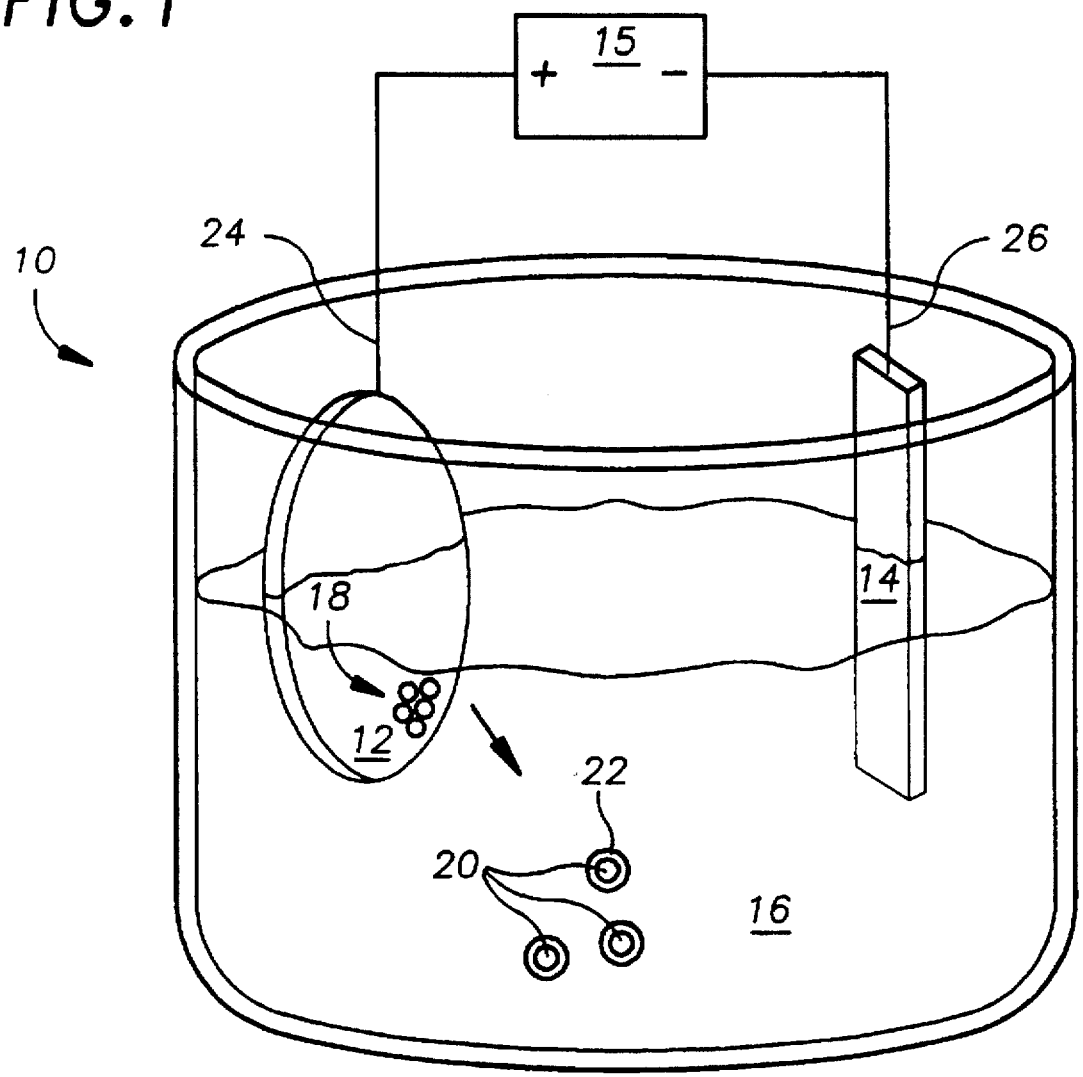
FIG. 1 is a schematic drawing of an anodic cell for producing semiconductor particles in accordance with the invention.

Referring to FIG. 1, there is shown an apparatus for processing bulk semiconductor material to produce nanometrically-sized semiconductor particles in accordance with the invention. In overview, the apparatus is employed as an electrochemical, i.e., anodic, cell 10 in which a bulk semiconductor starting material, e.g., a semiconductor wafer 12, and a conducting material piece 14 are employed as the anode and cathode of the cell, respectively. A power supply 15 is connected between the semiconductor wafer 12 and the conducting piece 14 to bias the semiconductor wafer 12 to a desired bias voltage with respect to the conducting piece 14 such that the wafer is anodically etched.

In operation, in brief, the semiconductor wafer and conducting material piece are both immersed, or at least partially submerged, in an electrolytic solution 16 consisting of an etchant and possibly a solvent, as is conventional for anodic etch systems, and further including a surfactant that is attracted to the semiconductor material. Under appropriate electrochemical cell conditions, given in detail below, the semiconductor bulk material 12 is anodically oxidized and etched at the wafer surface 18. During this anodic etch process, nanoparticles 20 of the semiconductor material are produced. The surfactant is electrically and/or chemically attracted to the nanoparticles and as a result, the surfactant effectively encapsulates each nanoparticle with a surface layer 22 of the surfactant in the electrolytic solution. Such encapsulated nanoparticles do not further etch and do not agglomerate in the solution. The nanoparticles can be separated out of the solution using conventional techniques. The size of the nanoparticles produced in accordance with the invention is controlled insitu by the etching process parameters. This etching process produces a relatively large volume of nanoparticles from a given bulk semiconductor and can do so in a relatively short time.

Considering now the electrochemical cell set up in more detail, the bulk semiconductor feed material can consist of a wafer 12, e.g., a conventional semiconductor wafer such as a 4-inch wafer. The bulk semiconductor feed material can alternatively consist of a piece of a wafer or a chunk, e.g., a cube or block, of bulk semiconductor material. This semiconductor feed material can be crystalline, polycrystalline, or amorphous. The semiconductor feed material can also be provided as a crystalline epitaxial layer of the semiconductor of interest. Similarly, the semiconductor feed material can be provided as a polycrystalline layer of the semiconductor of interest. Suitable example epitaxial and deposition processes for producing such crystalline and polycrystalline layers are described by Ghandhi in "VLSI Fabrication Principles," John Wiley & Sons, Inc., New York, 1983. In general, there are no limitations to the geometry of a piece of bulk feed semiconducting material to be processed in accordance with the invention save that the piece correspond to the type of semiconductor particles desired and that the piece is of sufficient size to make adequate electrical contact to the piece. The bulk feed material can consist of a piece of e.g., silicon, germanium, silicon carbide, or other semiconductor, can be n-type, p-type, or compensated, and can be amorphous, polycrystalline, or single crystalline of any crystallographic orientation.

The back side (not shown) of the bulk semiconductor piece to be etched is metallized for making connection to a wire 24 to connect with the power supply 15. In an example metallization process in which a 4-inch silicon wafer is to be etched, first a solution of 1 part hydrofluoric acid to 100 parts deionized water is used to etch off any native oxide residing on the back side of the silicon wafer. Then a thin layer of metal, e.g., a layer of aluminum of about 0.5 μm in thickness, is sputtered on the back surface; this sputtering is accomplished by way of, e.g., conventional dc magnetron sputtering techniques. Alternatively, a layer of metal is evaporated on the back surface of the wafer by way of conventional metal evaporation techniques, one suitable example evaporation process is given by Wolf and Tauber in "Silicon Processing for the VLSI Era," Vol. 1, Lattice Press, Sunset Beach Calif., 1986. In either case, the metal film is then preferably annealed, e.g., in an inert annealing process consisting of heating at a temperature of about 400° C. for about 30 minutes. Aside from aluminum, any suitable metal, e.g., nickel, indium, or cadmium, or any suitable metal alloy can be employed as the metallization layer.

In an alternative metallization process, a metal film is ultrasonically stenciled onto the back side of the semiconductor piece to be etched. In this case, a metal, e.g., indium, or a 1:1 indium cadmium alloy, or other suitable metal or metal alloy, is melted in a ceramic crucible using, e.g., a hot plate. The semiconductor piece, e.g., a wafer, is then placed on the hot plate for a time sufficient to reach a temperature greater than the melting point temperature of the metal; e.g., a temperature of about 200° C. is sufficient for indium or indium cadmium alloy. Then, using an ultrasonic soldering gun, the metal is secured to the back surface of the wafer. The wafer is then removed from the hot plate and allowed to cool to room temperature. Any excess indium or indium cadmium is removed from the wafer using a standard hydrochloric solution.

A wire, preferably a Teflon® (i.e., polytetrafluorocarbon) -coated copper wire, is soldered to the metallized surface of the semiconductor piece or wafer to be etched, for connection to a power supply. Any suitable wire gauge can be employed, e.g., a gauge of 18; but a heavier gauge may be desirable for electrochemical cell conditions in which high current densities are anticipated. In an alternative to a standard soldering process, a wire can be mechanically bonded to the metallized layer, or can be connected by other suitable means as is conventional. Once a wire is soldered to the metallized surface, that surface is preferably coated with an inert material such as wax to protect the metallized surface from the electrochemical etch solution when the piece is immersed in the solution.

The semiconductor bulk piece, partial wafer, wafer, or other bulk semiconducting starting material to be etched is then preferably cleaned by way of a standard six-step cleaning process. In one applicable example cleaning process, the semiconductor is processed in a series of the following six washes: 1) 15 minute ultrasonic agitation in a solution of trichloroethane at a temperature of 40° C.; 2) 15 minute ultrasonic agitation in a fresh solution of trichloroethane at a temperature of 40° C.; 3) 15 minute ultrasonic agitation in a solution of acetone at room temperature; 4) 15 minute ultrasonic agitation in a solution of methanol at room temperature; 5) 15 minute ultrasonic agitation in a solution of isopropanol at room temperature; and 6) 10 minute rinse in deionized water. The semiconductor piece or wafer is then dried using, e.g., a stream of nitrogen gas from, e.g., an air gun. Note that the ultrasonic agitation in cleaning steps three, four, and five may produce an increase in the cleaning solution temperature during the 15 minute immersion time; this is acceptable.

Referring again to FIG. 1, once a semiconductor bulk feed material 12 to be etched is cleaned, it is placed in an electrochemical cell set up as an anode, and a cathode piece 14, e.g., a piece of a conducting material, is likewise positioned in the cell. The cathode consists preferably of a noble metal, most preferably, platinum, or other suitable metal. The cathode piece can take the shape of a solid block, a grid, gauze, or other suitable geometry. A wire 26 is soldered or otherwise electrically connected to the cathode piece for connection to a power supply 15.

The semiconductor piece 12 and cathode 14 are submerged or at least partially submerged in an electrolytic solution including an etchant, an optional solvent, and a surfactant that is attracted to the semiconductor material. The surfactant is preferably, but not necessarily, insoluble in the electrolytic solution when combined with etched nanoparticles of the semiconductor piece. The solvent is optionally and preferably included, as is conventional in anodic etch systems, to improve etch uniformity during the etching process.

In one example in accordance with the invention, nanoparticle etching of a silicon wafer was accomplished using an electrolytic solution consisting of buffered hydrofluoric acid (BHF) etchant, provided by about 27% ammonium fluoride and about 7% hydrofluoric acid, and about 66% surfactant, provided by about 56% water and about 10% of an alkanolamine compound.

Considering each component of the electrolytic solution, the etchant component is selected based on the semiconductor being etched. For example, for the semiconductors silicon, silicon carbide, germanium, and other similar semiconductors, hydrofluoric acid (HF) or BHF is a preferred etchant for anodic etching in accordance with the invention; the etching parameters of HF and BHF are well-characterized. The HF or BHF component of the electrolytic solution preferably is less than about 75% of the electrolytic solution volume. BHF can be provided with a buffer like ammonium fluoride, or other suitable fluorine based additive, preferably as a solution component of less than about 50% of solution. As will be understood by those skilled in art, a buffering agent like ammonium fluoride is employed to replenish fluorine as it is depleted from the solution during etching. Such a buffering agent is thus not required; for a given etch process, fresh HF can be periodically added to the electrolytic solution.

As will be recognized by those skilled in the art, other etchant formulations are suitable for anodic etching like that employed in the particle etch technique of the invention. Accordingly, the invention does not contemplate use of only a specific etchant, but rather requires only that a suitable anodic etchant for the semiconductor to be etched be employed. For example, aside from HF and BHF, silicon and other like semiconductors can be etched in accordance with the invention with an etchant consisting of, e.g., a mixture of $H_2SO_4$, $H_2O$, and HF, a mixture of ethylene glycol, $KNO_2$, $H_2O$, and $Al(NO_3)_3$, or other suitable etchant composition.

The solvent component of the electrolytic solution is employed, as mentioned above, to provide uniformity of etch. Methanol, ethanol, propanol, or other suitable alcohol can be employed. The solvent component is not required, and in some applications, may not be desired.

The surfactant component of the electrolytic solution is employed to encapsulate semiconductor particles after their formation for inhibiting further etch of the particles, agglomeration of the particles, and redeposit of the particles onto the bulk semiconductor, and for enabling dispersion of the particles in the electrolytic solution. The invention does not require a specific surfactant, but rather, contemplates use of a suitable surfactant for a semiconductor being etched. The surfactant is characterized by its electrical and/or chemical attraction to the surface of the semiconductor particles. In other words, the surfactant's affinity for the semiconductor causes it to bond to the semiconductor particles' surfaces.

One suitable family of surfactants for particle etching of the semiconductor silicon is the family of alkanolamines. Alkanolamines are characterized as those compounds in which nitrogen is attached directly to the carbon of an alkyl alcohol. Suitable example alkanolamines include 2-amino-2-methyl-1-propanol $(CH_3(CH_3)(NH_2)CH_2OH)$, 2-amino-2-ethyl-1,3-propanediol $(HOCH_2C(C_2H_8)(NH_2)CH_2OH)$, tris(hydroxymethyl)aminomethane $(HOCH_2)_3CNH_2$, 2-dimethylamine-2-methyl-1-propanol $(CH_3)_2NC(CH_3)_2CH_2OH$, 2-amino-1-butanol $(CH_3CH_2CHNH_2)CH_2OH$, and 2-amino-2-methyl-1,3-propanediol $(HOCH_2C(CH_3)(NH_2)CH_2OH$; all of these alkanolamines are available commercially from Angus Chemical Co., of Buffalo Grove, Ill.

As will be recognized by those skilled in the art, other alkanolamines, and other families of surfactants are suitable for encapsulating etched nanoparticles of silicon or other semiconductors employed in the invention. The particular surfactant, e.g., an alkanolamine, may be provided as a mixture with another component, e.g., water; and furthermore, for example, the surfactant can include two or more components in which a base surfactant component is included in an amount ranging between about 0.5%–30% of the total multi-component surfactant volume. Whether a selected surfactant is employed alone or in combination with other components, the surfactant component of the electrolytic solution is preferably included in a range of between, e.g., about 20% to 80% of the total electrolytic solution volume. Considering other surfactants, the surfactant polyethyleneimine can be employed in accordance with the invention for encapsulating particles of the semiconductor silicon carbide. This surfactant is available from Chem Service, of West Chester, Pa.

Other components can be included in the electrolytic solution, as will be recognized by those skilled in the art. Such additives are limited in the invention only to the extent that they not inhibit the production of semiconductor particles by the anodic etching process of the invention.

The inventors have found at least one commercially available etch solution that provides an adequate etchant and surfactant and thus that can be employed in accordance o with the invention for producing semiconductor nanoparticles. The commercial BHF etchants BOE 930 Superwet and BOE 500 Superwet, both available from General Chemical, of Parsippany, N.J., contain BHF and an organic surfactant. These etchants are conventionally employed for oxide etching in standard semiconductor fabrication processing techniques. The inventors have found that the BOE 930 Superwet and BOE 500 Superwet etchants, when employed in accordance with the invention as an electrolytic solution in an anodic cell, achieved production and encapsulation of semiconductor nanoparticles on the order of a few nanometers in size.

Considering formation of nanoparticles of other semiconductor materials in a process in accordance with the invention, a suitable etchant-solvent-surfactant solution is selected, based on the considerations and examples given above, for a given semiconductor material, with a suitable surfactant being that which is attracted to the given semiconductor such that nanoparticles produced during the etch process are encapsulated by the surfactant and thus do not agglomerate in the solution or redeposit on the etching bulk feed material.

Turning now to other parameters of the nanoparticle etching process provided by the invention, under appropriate potential bias conditions, explained in detail below, a semiconductor bulk material feed piece employed as the anode in an electrolytic cell containing an electrolytic solution like that described above undergoes anodic etching in the cell. For example, a silicon bulk feed piece in an anodic cell including an electrolytic solution of HF and an alkanolamine, as described in the example above, etches in a process in which the silicon is first oxidized by the anodizing current of the cell. As with conventional anodic etching, the HF in the solution attacks the oxidized silicon, thereby etching away sections of the silicon; continuous oxidation occurs as the etching progresses.

As this oxidation-HF attack process proceeds, isolated silicon particles of less than about 1 μm in size are formed in an anodic electrocrystallisation process. While the specific etch potential and corresponding current density, as explained below, determine the particular size of the formed particles, in general it is believed that any level of active anodic etching will produce particles of less than about 1 μm in size; in experiments using the electrolytic solutions described above for etching silicon nanoparticles, the inventors found the production of silicon particles in the range of several nanometers for a wide range of cell conditions, requiring only the active anodic etching of the silicon. The ultimate equilibrium particle size that is attained during the etching process is further a function of the surface tension of the solution, the density of the particle, and the molecular weight of the semiconductor. These considerations are presented in detail in "Instrumental Methods in Electrochemistry," by the Southhampton Electrochemistry Group, Greef et al., Ellis Horwood, Inc. 1990., particularly in chapters three and nine.

Once formed, the semiconductor nanoparticles may or may not be initially coated with an oxide surface layer. In the case of silicon, any oxide surface layer that does exist is attacked by the HF in the electrolytic solution. Once removed from the silicon bulk environment, the nanoparticles are isolated from the anodizing current and do not further oxidize or etch.

At this point, the surfactant, e.g., an alkanolamine in the case of silicon, is attracted to the oxide-free silicon nanoparticles and encapsulates them separately, whereby agglomeration of the nanoparticles does not occur and the particles do not redeposit on the etching wafer. Once encapsulated, nanoparticles are isolated both from the etch process and from each other. The encapsulated nanoparticles may disperse and form a suspension in the solution or may form a precipitate out of the solution. Supersaturation of the solution with a nanoparticle suspension results in precipitation of the excess nanoparticle volume out of the solution.

In the example given above, in which bulk silicon was etched in an electrolytic solution of BHF and an alkanolamine, silicon nanoparticles were formed. When illuminated with ultraviolet light, the produced silicon nanoparticles luminesced in the visible light region. This luminescence indicated that at least a fraction of the nanoparticles were of a size dimension of no greater than about 10 nm. A range of nanoparticle sizes may be expected to be produced by a given particle etch process.

The anodic etching of the semiconductor bulk material can be maintained, with the considerations given below, until the entire bulk feed material is consumed. A nanoparticle volume yield of at least about 10% of the starting material volume is produced as the etching progresses. As explained below, the nanoparticles produced in this way are easily separated from the electrolytic solution. The nanoparticle etch technique of the invention thereby provides an elegantly simple, relatively fast and inexpensive, and high-volume process for producing nanometrically-sized semiconductor particles.

Considering now specific etch process variables in accordance with the invention, the volume of electrolytic solution required to etch a given volume of bulk semiconductor starting material is dependent on many factors, including the size of the piece. For the semiconductor silicon, one cubic centimeter of the example electrolytic solution given above, i.e., a solution including a buffered hydrofluoric acid etchant of 27% ammonium fluoride and 7% hydrofluoric acid, and 66% water-alkanolamine, was found to etch about 0.2 grams of silicon. In this experiment, an entire 4-inch silicon wafer was consumed using 500 ml of this electrolytic solution and at least one additional wafer could be processed by this same 500 ml electrolytic solution.

The electrolytic solution is preferably maintained at room temperature during the etch process, but other temperatures are acceptable. It must be noted, however, that temperatures below about 50° F. may result in precipitation of the surfactant out of the solution. Movement of a semiconductor piece in the solution during an etch process, e.g., ultrasonic agitation of the piece, results in an increase in solution temperature. Such a temperature increase causes a corresponding increase in the etch rate of the semiconductor piece. Aside from ultrasonic agitation, simple stirring or other movement of the solution produces similar increased etch rates. Bubbling of an inert gas, e.g., nitrogen, may also be employed as a stirring technique. Alternatively, a decrease in etch rate is attained by periodic withdrawal and re-immersion of the etching bulk feed material out of and into the electrolytic solution. This is accomplished by, e.g., lifting of the bulk feed material from the cell, or by lowering of the cell below the feed material if the feed material is anchored at a vertical position.

Preferably, with a semiconductor piece 12 and a cathode 14 immersed in the electrolytic solution and connected to the power supply 15, the power supply is set to bias the bulk semiconductor feed piece at a positive potential with respect to the cathode. This potential is in turn set based upon a desired anodizing current density to be established at the surface of the semiconductor material during the etching process. This anodizing current is provided by the closed electrical loop formed of the semiconductor anode 12, the cathode 14, the electrolytic solution 16, which inherently contains ions that conduct current between the anode and cathode, and the electrical connection between the anode and cathode through the power supply 15, which consists of a conventional, commercially available power supply. Given, e.g., a 4-inch silicon wafer having a back side entirely metallized, the anodizing current density at the front side of the wafer is preferably between about 10 mA/cm$^2$ and 100 mA/cm$^2$ during the etch process for achieving a controllable etch rate; this sets the semiconductor wafer at a positive bias potential of between about 0.5 V and 10 V. In the experiment described above, in which a silicon wafer was etched, a 20 mA/cm$^2$ anodizing current density was maintained at the 4-inch silicon wafer surface; with this current, the wafer was entirely consumed in about 20 minutes. As is to be expected, higher current densities increase etch rate. Additionally, for a given etchant concentration and temperature, higher current densities can, under some conditions, result in smaller semiconductor particle sizes. Similarly, for a given current density and temperature, higher etchant concentrations can, under some conditions, result in smaller semiconductor particle sizes. Furthermore, for a given etchant concentration and current density, higher temperatures can, under some conditions, result in smaller semiconductor particle sizes.

If a single point contact on the wafer, rather than a blanket metallized layer, is used, the anodizing current density can be as high as several amps/cm$^2$ in the vicinity of the etching, which primarily takes place at the electrolyte-air interface. Periodic withdrawal of the semiconductor piece from the electrolytic solution breaks the conductor circuit and decreases the average anodizing current density to reasonable levels to maintain controllable etch progression.

As is well-recognized in the field of anodic etching, the conductivity of the material being etched enables the electrochemical etch reaction by providing a conductive path to close the anodic current loop. The current density at the semiconductor etching surface should preferably not fall below 1 nano-amp/cm$^2$, in order to maintain progressing of the anodic etching process. If the semiconductor piece is of a high resistance, it then is preferably correspondingly thin, and preferably the entire back side of the piece is metallized. For example, a 4-inch silicon wafer anode of about 0.020 inches in thickness and of conventional resistivity provides adequate conductivity.

The conductivity of bulk semiconductor pieces or wafers that are of low conductivity can be increased during the etching process by illuminating the back side of the semiconductor with a laser or other high-intensity light source while the semiconductor is immersed in the electrolytic solution. Such illumination creates excess holes at the surface of the material that act as enhanced conductivity pathways.

More importantly, perhaps, anodic etching of a semiconductor fundamentally requires the presence of electronic holes at the surface of the semiconductor material to enable anodizing oxidation of the semiconductor surface. In the case of a p-type semiconductor, a supply of holes is inherently available in the material. In the case of an n-type semiconductor, however, such a supply of holes is not available. The necessary supply of holes is in this case necessarily artificially created and can be provided using a laser or other high-intensity light source illuminating the semiconductor.

A suitable laser source for this application consists of any laser that produces coherent radiation of a wavelength less than about 700 nanometers and greater than about 100 nanometers. The laser is preferably raster-scanned over the backside of the semiconductor surface or employed in combination with a beam expander to illuminate the entire back surface simultaneously. The light source can alternatively consist of, e.g., a tungsten-halogen bulb, xenon arc lamp, or other high-intensity light source. Other considerations for techniques to produce excess holes by surface illumination are described by Lehmann in "The Physics of Macropore Formation in Low Doped n-type Silicon," *J. Electrochem. Soc.*, Vol. 140, No. 10, pp. 2836–2843, 1993.

With the above considerations, the nanoparticle etch process of the invention provides efficient production of a precipitate or suspension of nanoparticles in the electrolytic etch solution. In either case, the nanoparticles are separated out of the solution by, e.g., the following process. Here, the electrolytic solution including the nanoparticles is first diluted by a factor of about 10 with deionized water. The resulting solution is then transferred to a beaker, preferably a Teflon® beaker, connected with a vacuum fitting. The beaker of solution is secured to a vacuum source and then heated gently to a temperature of about 30° C. With this set up, the beaker is evacuated for about 10 hours. This results in evaporation of the solution, whereby the semiconductor nanoparticles are obtained in a dry state.

In an alternative nanoparticle separation process, the semiconductor nanoparticles are filtered out of the solution using filter paper secured in a filter holder. In this case, a filter pump is employed with a beaker of the solution to draw the solution through the filter paper and trap the nanoparticles on the filter paper. In another alternative nanoparticle separation process, the electrolytic solution including the nanoparticles is centrifuged and then the electrolytic solution decanted to remove the solution. Multiple centrifuge operations can be performed, each with the addition of deionized water, to completely separate the particles out of the solution. In yet other nanoparticle separation processes, the electrolytic solution including the nanoparticles is freeze-dried, using conventional freeze-drying techniques, or is simply dried, whereby the solution is removed to produce dried nanoparticles.

Depending on the anticipated application or use for semiconductor nanoparticles produced in accordance with the invention, the surfactant encapsulating the particles can be removed or alternatively, the particles may be employed with the surfactant remaining on the particles. If it is desired to remove the surfactant, a surfactant-dissolving solution, e.g., a solution including an ether or alcohol, is mixed with the nanoparticles, once separated out of the electrolytic solution. Agitation of the nanoparticles in the solution acts to remove the surfactant from the particles. After conventional rinsing, the particles can then be further processed, for example by terminating their surfaces by reaction with methane, to produce a hydrogen termination, or by other surface termination reaction, as is conventional.

Once a desired volume of etched semiconductor nanoparticles is recovered from the electrolytic solution and the surfactant is removed, the nanoparticles can be further processed to "fine tune" their dimensions. For example, if it is desired to decrease the size of the etched nanoparticles, an etch procedure can be employed. In one such suitable etch procedure, the nanoparticles of, e.g., silicon, are alternately oxidized and subjected to an etchat that attacks the oxide. This oxidation-etch process removes surface layers of the nanoparticles and can be employed multiple times to achieve a precise desired nanoparticle dimension. Oxidation is carried out by, e.g., immersion of the nanoparticles in boiling water for about 30 minutes; etch is carried out by, e.g., immersion in a solution of water and HF in a 10:1 ratio for about, e.g., 1 minute.

If it is instead desired to increase the size of the recovered nanoparticles, a conventional annealing process can be employed. In one example annealing process, the nanoparticles are thermally annealed in a conventional annealing furnace at a temperature of about 600° C. for a time period of, e.g., about 2 minutes. Alternatively, the nanoparticles can be annealed in a conventional rapid-thermal annealing furnace; a temperature of about, e.g., 800° C. and a time of about, e.g., 30 seconds, is adequate. In an alternative, non-thermal annealing process, a laser pulses are applied to the nanoparticles. Specific considerations for such an optical annealing process are provided by Sameshima in "Pulsed-Laser Annealing of Silicon Films," *Mat. Res. Soc. Symp. Proc.*, Vol. 283, pp. 679–689, 1993.

Semiconductor nanoparticles produced by the foregoing process in accordance with the invention are particularly well-suited to a wide range of microelectronic applications, including quantum dot microelectronic devices, electroluminescent display devices, photoluminescent display devices, and the many other microelectronic applications for which nanometrically-sized semiconductor particles are used.

From the foregoing, it is apparent that the nanoparticle etch production process described above not only achieves relatively fast, inexpensive, and high-volume production of nanoparticles, but does so with an elegantly uncomplicated apparatus and procedure. It is recognized, of course, that those skilled in the art may make various modifications and additions to the preferred embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for producing semiconductor particles in solution, comprising the steps of:

providing a semiconductor material in an electrolytic solution of an anodic cell configured with a cathode positioned in the electrolytic solution, the electrolytic solution comprising an etchant and a selected surfactant that is characterized by an attractive affinity for the semiconductor material; and applying an electrical potential between the semiconductor material and the cathode in the electrolytic solution to anodically etch the semiconductor material and remove particles from the material to produce particles of the semiconductor material in the solution, the selected surfactant acting to encapsulate semiconductor particles in the solution to inhibit etching of the particles and to prevent agglomeration of the particles in the solution.

2. The method of claim 1 wherein the cathode comprises a noble metal.

3. The method of claim 2 wherein the cathode comprises platinum.

4. The method of claim 1 wherein the etchant comprises hydrofluoric acid.

5. The method of claim 4 wherein the electrolytic solution further comprises a solvent.

6. The method of claim 5 wherein the solvent comprises methanol.

7. The method of claim 4 wherein the electrolytic solution further comprises ammonium fluoride.

8. The method of claim 1 wherein the surfactant comprises a compound that is characterized as an alkanolamine.

9. The method of claim 1 wherein the surfactant comprises polyethyleneimine.

10. The method of claim 1 wherein the electrical potential applied between the semiconductor material and the cathode is set at a potential to bias the semiconductor material at a positive electrical voltage with respect to the cathode.

11. The method of claim 10 further comprising the step of illuminating the semiconductor material placed in the anodic cell electrolytic solution.

12. The method of claim 1 further comprising the step of separating the semiconductor particles out of the anodic cell electrolytic solution.

13. The method of claim 12 wherein the semiconductor particles are separated out of the anodic cell electrolytic solution by centrifuging the particles in the electrolytic solution.

14. The method of claim 12 wherein the semiconductor particles are separated out of the anodic cell electrolytic solution by filtering the particles out of the electrolytic solution.

15. The method of claim 12 further comprising the step of annealing the semiconductor particles separated out of the anodic cell electrolytic solution.

16. The method of claim 12 further comprising the step of etching the semiconductor particles separated out of the anodic cell electrolytic solution.

17. The method of claim 1 wherein the semiconductor material comprises silicon.

18. The method of claim 1 wherein the semiconductor material comprises a semiconductor wafer.

19. The method of claim 18 wherein the semiconductor wafer comprises a silicon wafer.

20. The method of claim 1 wherein the semiconductor material comprises silicon carbide.

21. The method of claim 1 wherein at least a portion of the formed particles of the semiconductor material are of a size less than about 1000 nanometers.

22. The method of claim 21 wherein at least a portion of the formed particles of the semiconductor material are of a size less than about 100 nanometers.

23. The method of claim 22 wherein at least a portion of the formed particles of the semiconductor material are of a size less than about 10 nanometers.

\* \* \* \* \*

UNITED STATES PATENT AND TRADEMARK OFFICE
CERTIFICATE OF CORRECTION

PATENT NO : 5,690,807
DATED : November 25, 1997
INVENTOR(S): Harry R. Clark, Jr. and Brian S. Ahern It is certified that error appears in the above-identified patent and that said Letters Patent is hereby corrected as shown below:

At Item 56 on the cover page, under "Other Publications" should be added the following:

Sameshima, "Pulsed-Laser Annealing of Silicon Films," Mat. Res. Soc. Symp. Proc., Vol. 283, pp. 679-689, 1993.

Signed and Sealed this

Second Day of June, 1998

*Attest:*

BRUCE LEHMAN

*Attesting Officer*   *Commissioner of Patents and Trademarks*